(12) United States Patent
Wang et al.

(10) Patent No.: US 11,576,253 B2
(45) Date of Patent: Feb. 7, 2023

(54) PRINTED CIRCUIT BOARD FOR BASE STATION ANTENNA

(71) Applicant: CommScope Technologies LLC, Hickory, NC (US)

(72) Inventors: Xiaotuo Wang, Suzhou (CN); Hangsheng Wen, Suzhou (CN); Shuguang Shao, Suzhou (CN); Nengbin Liu, Suzhou (CN); Martin L. Zimmerman, Chicago, IL (US)

(73) Assignee: CommScope Technologies LLC, Hickory, NC (US)

( * ) Notice: Subject to any disclaimer, the term of this patent is extended or adjusted under 35 U.S.C. 154(b) by 81 days.

(21) Appl. No.: 17/151,846

(22) Filed: Jan. 19, 2021

(65) Prior Publication Data

US 2021/0227684 A1 Jul. 22, 2021

(30) Foreign Application Priority Data

Jan. 22, 2020 (CN) .......................... 202010074196.4

(51) Int. Cl.
*H01Q 1/38* (2006.01)
*H05K 1/02* (2006.01)
(Continued)

(52) U.S. Cl.
CPC ......... *H05K 1/0243* (2013.01); *H01Q 13/206* (2013.01); *H01Q 1/246* (2013.01); *H01Q 23/00* (2013.01); *H05K 2201/10098* (2013.01)

(58) Field of Classification Search
CPC ...... H01Q 13/20; H01Q 13/206; H01Q 23/00; H01Q 1/24; H01Q 1/246; H01Q 1/38; H01Q 21/00; H05K 1/02; H05K 1/0243; H05K 1/16; H05K 2201/10295; H05K 2201/10098; H05K 2201/10363; H05K 3/22; H05K 3/222; H05K 7/06
See application file for complete search history.

(56) References Cited

U.S. PATENT DOCUMENTS 6,480,166 B2 * 11/2002 Tsai ................... H01Q 21/0006
343/815
7,170,361 B1 * 1/2007 Farnworth ............. H01P 3/088
257/778

(Continued)

FOREIGN PATENT DOCUMENTS

| CN | 201839512 U | 5/2011 |
| CN | 102316663 B | 3/2013 |
| CN | 111900536 A * | 11/2020 |

*Primary Examiner* — Tho G Phan
(74) *Attorney, Agent, or Firm* — Myers Bigel, P.A.

(57) ABSTRACT

Printed circuit boards for a base station antenna include a substrate layer, and a first conductive trace and a second conductive trace which are printed on the substrate layer and cross each other. The first conductive trace has two trace sections separated by the second conductive trace. Adjacent ends of the two trace sections separated by the second conductive trace are connected electrically by a jumper. The jumper has an electrical conductor, is isolated electrically from the second conductive trace and is fixed on the printed circuit board. The electrical conductor and the two trace sections are connected electrically at adjacent ends. The printed circuit board allows flexible wiring of the conductive traces on the printed circuit board.

19 Claims, 5 Drawing Sheets

(51) Int. Cl.
*H01Q 13/20* (2006.01)
*H01Q 1/24* (2006.01)
*H01Q 23/00* (2006.01)

(56) References Cited

U.S. PATENT DOCUMENTS

| | | | |
|---|---|---|---|
| 9,445,492 B2* | 9/2016 | Chen | H05K 3/222 |
| 9,742,064 B2* | 8/2017 | Paulotto | H01Q 9/0421 |
| 2010/0201578 A1* | 8/2010 | Parsche | H01Q 1/38 |
| | | | 343/866 |
| 2017/0117620 A1* | 4/2017 | Lapushin | H01Q 1/243 |

* cited by examiner

PRINTED CIRCUIT BOARD FOR BASE STATION ANTENNA

RELATED APPLICATIONS

This patent application claims priority to and the benefit of Chinese Patent Application Serial Number 202010074196.4 filed Jan. 22, 2020, the content of which is hereby incorporated by reference as if recited in full herein.

FIELD

The present invention relates to the technical field of base station antennas and, in particular to printed circuit boards (PCB) for base station antennas that can be used, for example, as feed boards or as calibration boards.

BACKGROUND

A mobile communication network includes a large number of base stations, each of which may include one or more base station antennas for receiving and transmitting radio frequency (RF) signals. A single base station antenna may include many radiating elements, which may also be referred to as radiators, antenna dipoles, antenna elements, etc. The radiating elements may be disposed on a base board, which may include a feed board and a reflector, and optionally a calibration board. The feed board and the calibration board may each be implemented using printed circuit boards.

Especially in the 5G era, the number of radiating elements arranged on the base board per unit area is increasing. Correspondingly, the density of conductive traces for the radiating elements on the feed boards is also increasing, which makes the wiring of the conductive traces on the feed boards more difficult.

SUMMARY

An object of the present invention is to provide a PCB for a base station antenna, whereby flexible wiring on the PCB may be allowed.

Embodiments of the invention are directed to a PCB for a base station antenna, with a substrate layer, and a first and a second conductive trace which are printed on the substrate layer and cross each other. The first conductive trace has two trace sections separated by the second conductive trace. Adjacent ends of the two trace sections that are separated by the second conductive trace are electrically connected by a jumper. The jumper has an electrical conductor, is isolated electrically from the second conductive trace and is fixed to the PCB. The electrical conductor is electrically connected to the two trace sections at the adjacent ends.

By this configuration, crossing of the conductive traces may be allowed, and the conductive traces crossing each other may be isolated electrically from each other.

The PCB may be referred to as a large board, a large PCB or a main PCB.

In some embodiments, the jumper may be a separate component and may be fixed to the PCB by soldering. The electrical conductor may be electrically connected to the two trace sections at said adjacent ends by soldering.

In some embodiments, the jumper may have a plug element that may be inserted into a hole in the PCB.

In some embodiments, the jumper may be composed of only the electrical conductor, which may be configured as a bridge element, and which may have at least one needle-like projection as the plug element.

In some embodiments, the electrical conductor may have two pairs of needle-like projections, and the PCB may have corresponding two pairs of holes for receiving these needle-like projections in a region of said adjacent ends of the two trace sections.

In some embodiments, the PCB may have a grounding layer that may have openings around the holes for receiving the needle-like projections for electrical isolation.

In some embodiments, the jumper may be configured as a PCB element, which may have a substrate layer and a conductive trace as the electrical conductor.

In some embodiments, the PCB element may be a separate component and may be fixed to the PCB by soldering. The conductive trace of the PCB element may be electrically connected to the two trace sections at said adjacent ends by soldering.

In some embodiments, the PCB element may be made integrally with the PCB.

In some embodiments, the PCB element may be disposed on the PCB in a standing manner.

In some embodiments, the PCB element may be configured as a bridge element with two legs, and the PCB can have two holes inserted by the two legs in the region of the adjacent ends, and the conductive trace of the PCB element can be soldered with the adjacent ends of the two trace sections in the region of the two legs.

In some embodiments, the PCB may have a grounding layer, and the PCB element may have a grounding layer. At least one of the two holes may be formed as a plated through hole (PTH). The grounding layer of the PCB element can be electrically connected to the grounding layer of the PCB by soldering in the PTH.

In some embodiments, the PCB element may be disposed horizontally on the PCB.

In some embodiments, the conductive trace of the PCB element may be disposed on a side of the substrate layer of the PCB element facing away from the PCB, and the PCB element has two PTHs in contact with the conductive trace of the PCB element, wherein the PCB element is electrically connected to one of said adjacent ends of the two trace sections through a first of the two PTHs, and is electrically connected to the other of said adjacent ends of the two trace sections through a second of the two PTHs.

In some embodiments, the PCB element may be soldered with one of said adjacent ends of the two trace sections through the first PTH and may be soldered with the other of said adjacent ends of the two trace sections through the second PTH.

In some embodiments, the PCB may have a grounding layer, and the PCB element may have a grounding layer, and the grounding layer of the PCB element and the grounding layer of the PCB may be electrically connected through a third PTH extending in the PCB and in the PCB element.

In some embodiments, the PCB element may have an additional substrate layer on a side of its grounding layer opposite to the substrate layer of the PCB element.

In some embodiments, the PCB may have three adjacent first conductive traces extending side by side, and the three first conductive traces may be configured as a coplanar waveguide structure, wherein a central one of the first conductive traces is configured as a signal trace, and the other two first conductive traces are configured as grounding traces, wherein the three first conductive traces are respectively interrupted by the second conductive trace into two trace sections, and the respective two trace sections of each of the first conductive traces are electrically connected to each other by the common jumper. Alternatively, the first conductive traces may be electrically connected by respective jumpers.

In some embodiments, the PCB element may have three conductive traces which extend side by side and are adjacent to each other, as the electrical conductors, and each conductive trace of the PCB element is electrically connected to the two adjacent ends of one of the three first conductive traces through corresponding PTHs.

In some embodiments, the first and the second conductive trace may be micro strip lines respectively.

In some embodiments, the PCB may be a feed board for radiating elements of a base station antenna. Alternatively, the PCB may be a calibration board for a base station antenna.

Technical features mentioned above, technical features to be described later, and technical features shown in the drawings may be combined with each other arbitrarily, even if they are mentioned in different paragraphs or in different embodiments, as long as they are not contradictive with each other. All technically feasible combinations of features are included in this application.

BRIEF DESCRIPTION OF THE DRAWINGS

The present invention will be further described below with the aid of specific embodiments with reference to the accompanying drawings. In the drawings.

DETAILED DESCRIPTION

Figure 1:
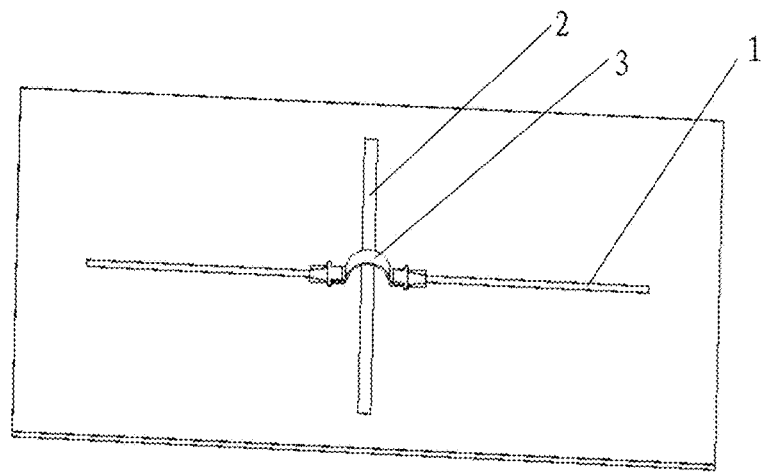
FIGS. 1 and 2 are a schematic perspective view and an exploded view, respectively, of a PCB for a base station antenna according to a first embodiment.
Figure 2:
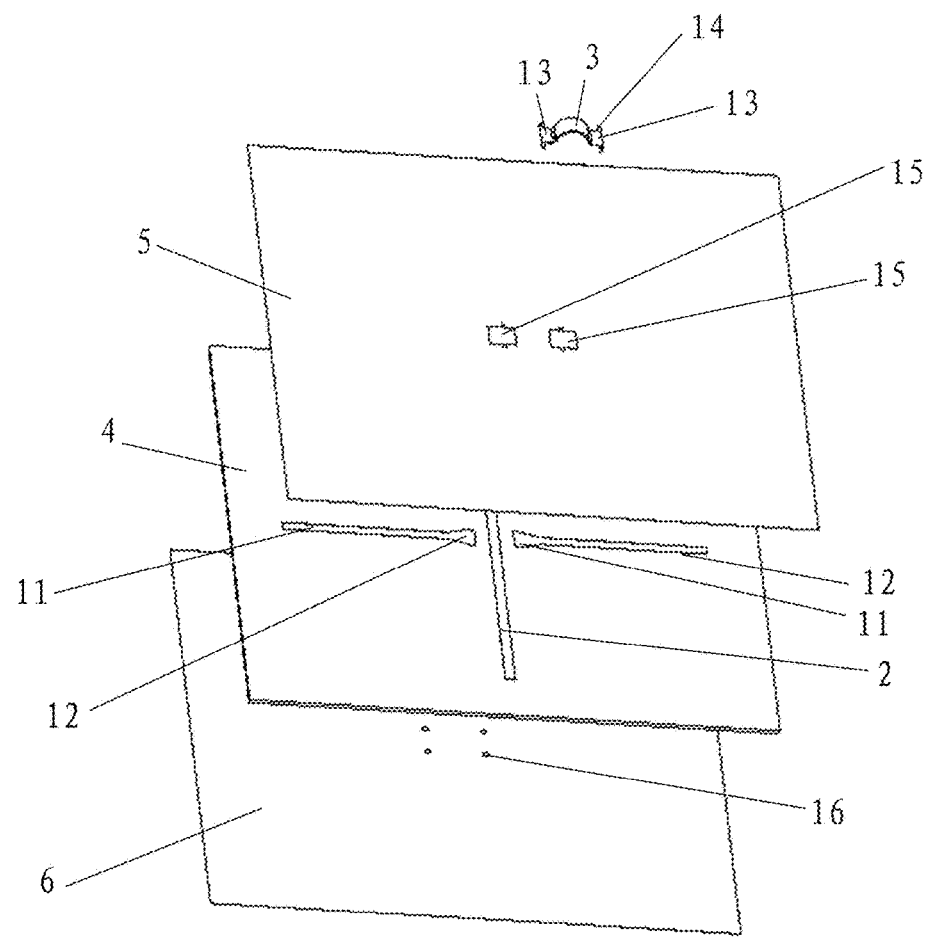

FIGS. 1 and 2 are a schematic perspective view and an exploded view, respectively, of a PCB for a base station antenna according to a first embodiment. In FIGS. 1 and 2, the PCB for a base station antenna is illustrated partially. The PCB may be, for example, a feed board for a base station antenna, and the feed board may form a board assembly with a reflector not shown. Radiating elements (not shown) may be distributed on the board assembly, and these radiating elements may transmit and/or receive RF signals. Many conductive traces may be provided on the feed board, and they are electrically connected to the respective radiating elements. It will also be appreciated that the PCB may be a calibration board for a base station antenna, which may be configured to calibrate the amplitude and phase of the radiating elements of the base station antenna. The conductive traces on the PCB may be respective microstrip lines, striplines or any other conductors applied on the substrate layer(s) of the PCB.

In the first embodiment, the PCB has a substrate layer 4, a solder mask 5 provided on one side of the substrate layer 4, and a grounding layer 6 provided on the other side of the substrate layer 4. These layers may be made integrally. The solder mask 5 is typically a lacquer layer applied to the substrate layer. The grounding layer 6 is typically a conductive material applied to the substrate layer. The PCB has a first conductive trace 1 and a second conductive trace 2 which are printed on the substrate layer 4 and cross each other, as shown in FIG. 1. In FIGS. 1 and 2, a single first conductive trace 1 and a single second conductive trace 2 can be seen. However, it will also be appreciated that a single first conductive trace 1 and a plurality of second conductive traces 2 extending side by side may cross each other, or a plurality of first conductive traces 1 extending side by side and a plurality of second conductive traces 2 extending side by side may cross each other. The first conductive trace 1 has two trace sections 11 that are separated from each other by the second conductive trace 2, and the adjacent ends 12 of the two trace sections 11 that are separated by the second conductive trace 2 are electrically connected by a jumper 3.

In the first embodiment, the jumper 3 may comprise an electrical conductor, which may be made of sheet metal, and may be configured as a bridge element. This bridge element has a bent portion and two end regions 13. The second conductive trace 2 passes below the bent portion and is electrically isolated from the jumper 3. Each end region 13 has two needle-like projections 14. These needle-like projections 14 can be inserted into respective holes in the PCB. The PCB has two corresponding pairs of holes that receive the needle-like projections 14 in the region of said adjacent ends 12 of the two trace sections 11. The holes may or may not extend all of the way through the thickness of the PCB, for example, the holes may extend only through the solder mask 5 and part of the way into the substrate layer 4, or through the solder mask 5 and all of the way into the substrate layer 4.

In the first embodiment, each end region 13 of the bridge element may be electrically connected to one of the two adjacent ends 12 of the first conductive trace 1 by soldering. To facilitate such soldering, the solder mask 5 may have two openings 15. In addition, for improved electrical performance, the grounding layer 6 of the PCB may have openings 16 around the holes for receiving the needle-like projections 14 in order to electrically isolate the needle-like projections 14 from the grounding layer 6 (in embodiments in which the needle-like projections 14 extend all of the way through the substrate layer 4).

The needle-like projections 14 of the bridge element may be used to improve an impedance match of the bridge element with the PCB, and therefore can improve the return loss performance of the PCB.

Figure 3:
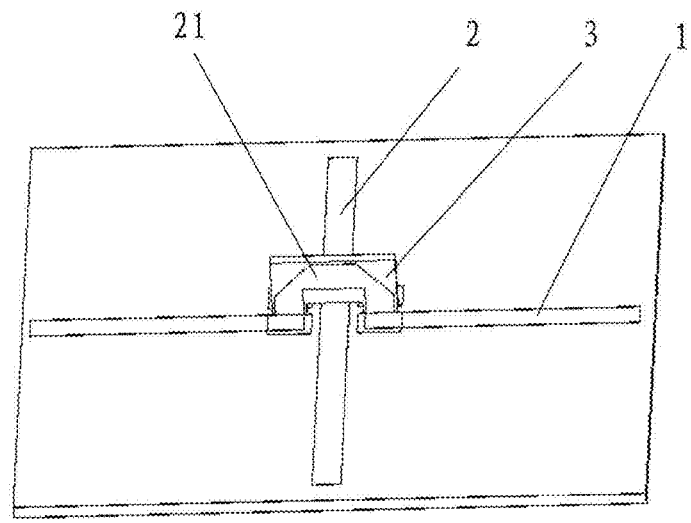
FIGS. 3 and 4 are a schematic perspective view and an exploded view, respectively, of a PCB for a base station antenna according to a second embodiment.
Figure 4:
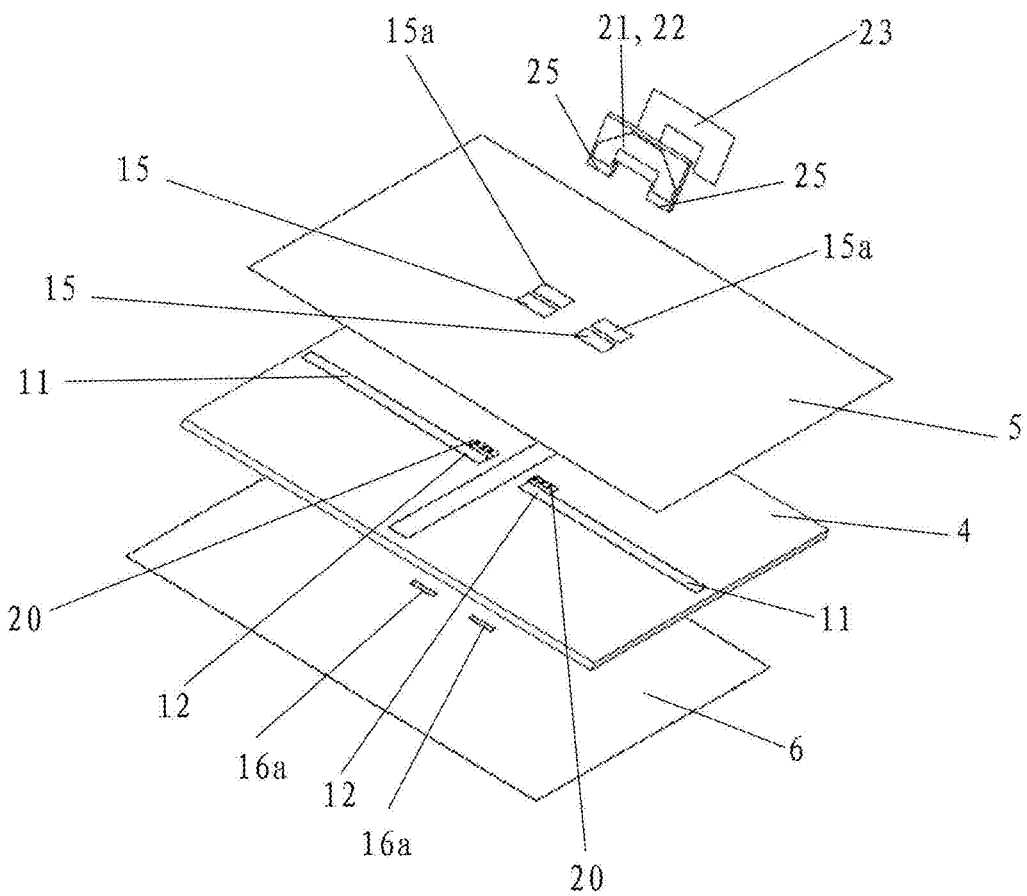

FIGS. 3 and 4 are a schematic perspective view and an exploded view, respectively, of a PCB for a base station antenna according to a second embodiment. In FIGS. 3 and 4, the PCB is again only illustrated partially. The PCB may be, for example, a feed board for a base station antenna.

In the second embodiment, the PCB has a substrate layer 4, a solder mask 5 provided on one side of the substrate layer 4, and a grounding layer 6 provided on the other side of the substrate layer 4. These layers may be made integrally. The PCB has a first conductive trace 1 and a second conductive trace 2 which are printed on the substrate layer 4 and cross each other. The first conductive trace 1 has two trace sections 11 separated by the second conductive trace 2, and adjacent ends 12 of the two trace sections 11 that are separated by the second conductive trace 2 are electrically connected by a jumper 3.

In the second embodiment, the jumper 3 is also a separate component and is fixed to the PCB by soldering. The jumper 3 is configured as a PCB element that has a substrate layer 22, a conductive trace 21 provided on one side of the substrate layer 22 as the electrical conductor, and a grounding layer 23 that is provided on the other side of the substrate layer 22. The PCB element that is used to form the jumper 3 is typically made integrally. The PCB element may be referred to as a small board or a small PCB.

In the second embodiment, the PCB element is disposed on the PCB in a standing manner. In other words, the planes defined by the major surfaces of the substrate layer 22 of the PCB element are substantially perpendicular to the planes defines by the major surfaces of the substrate layer 4 of the PCB. The PCB element is configured as a bridge element with two legs 25, and the PCB has two holes 20 that are adjacent the respective ends 12 of the two trace sections 11 of the first conductive trace 1. The two legs 25 of the PCB element are inserted into the respective holes 20 to mount the PCB element on the PCB. The solder mask 5 includes a first pair of openings 15 that expose respective ends 12 of the trace sections 11, and a second pair of openings 15a that are above the holes 20 in the PCB. The ends of the conductive trace 21 of the PCB element are soldered to the respective ends 12 of the two trace sections 11 of the first conductive trace 1 that are exposed through the openings 15 in the solder mask 5. In some embodiments, the two holes 20 through the PCB may be formed as plated through holes (PTHs), and the grounding layer 23 of the PCB element may be electrically connected to the grounding layer 6 of the PCB by solder. To this end, the side of the substrate layer 4 that includes the first and second conductive traces 1, 2 may further include two conductive pads (i.e., widened regions) at the ends 12 of the trace sections 11 that facilitate soldering and electrically connecting the conductive trace 21 to the first conductive trace 1, and two additional conductive pads that partially or fully surround the holes 20 that facilitate soldering and electrically connecting the grounding layer 23 to the grounding layer 6. The two holes 20 may be through holes in the PCB, and in turn two slits 16a in the grounding layer 6 can be seen in FIG. 4 that electrically isolate the grounding layer 6 from the conductive traces 21 (to the extent that the conductive traces 21 extend to the grounding layer 6 when the PCB element is inserted into the holes 20 in the PCB).

In the second embodiment, the optional grounding layer 23 of the jumper 3 may be used to better impedance match the microstrip transmission line on the PCB element to the PCB, and thus may improve the return loss performance of the PCB.

Figure 5:
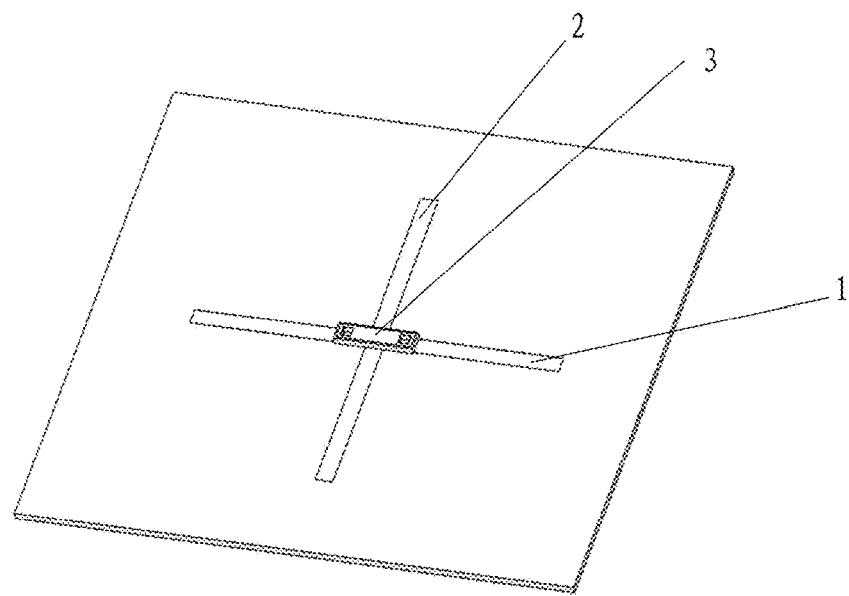
FIGS. 5 and 6 are a schematic perspective view and an exploded view, respectively, of a PCB for a base station antenna according to a third embodiment.
Figure 6:
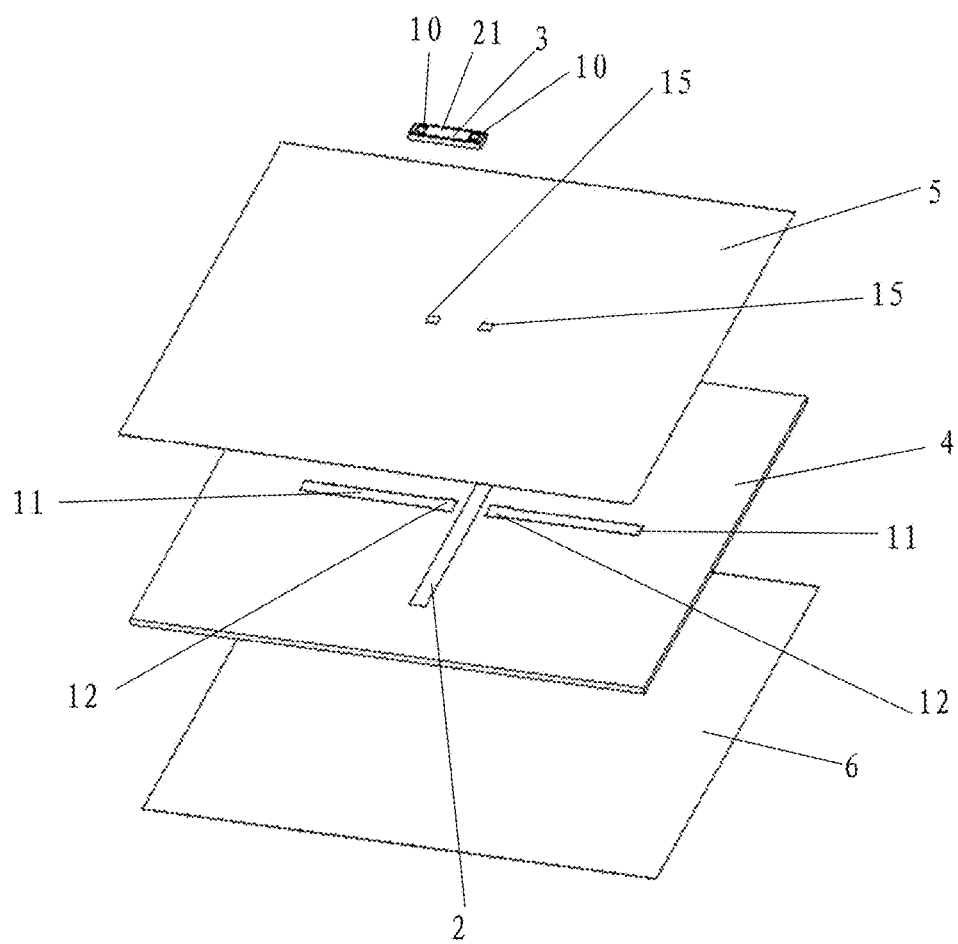

FIGS. 5 and 6 are a schematic perspective view and an exploded view, respectively, of a PCB for a base station antenna according to a third embodiment. In FIGS. 5 and 6, the PCB for a base station antenna is only partially illustrated. The PCB may be, for example, a feed board for a base station antenna.

In the third embodiment, the PCB has a substrate layer 4, a solder mask 5 provided on one side of the substrate layer 4, and a grounding layer 6 provided on the other side of the substrate layer 4. These layers may be formed integrally. The PCB has a first conductive trace 1 and a second conductive trace 2 which are printed on the substrate layer 4 and cross each other. The first conductive trace 1 has two trace sections 11 that are separated by the second conductive trace 2, and adjacent ends 12 of the two trace sections 11 that are separated by the second conductive trace 2 are electrically connected by a jumper 3.

In the third embodiment, the jumper 3 is configured as a PCB element that has a substrate layer and a conductive trace 21 as the electrical conductor and has no grounding layer. The substrate layer of the PCB element is mounted to the PCB horizontally so that the major surfaces of the substrate layers of the PCB and PCB element are parallel to each other. The PCB element has two PTHs 10 that are electrically connected to the conductive trace 21. The PCB element is electrically connected to one of said adjacent ends 12 of the two trace sections 11 by soldering through a first of the two PTHs and is electrically connected to the other of said adjacent ends 12 of the two trace sections 11 by soldering through a second of the two PTHs. For such soldering, the solder mask 5 may have two openings 15.

Figure 7:
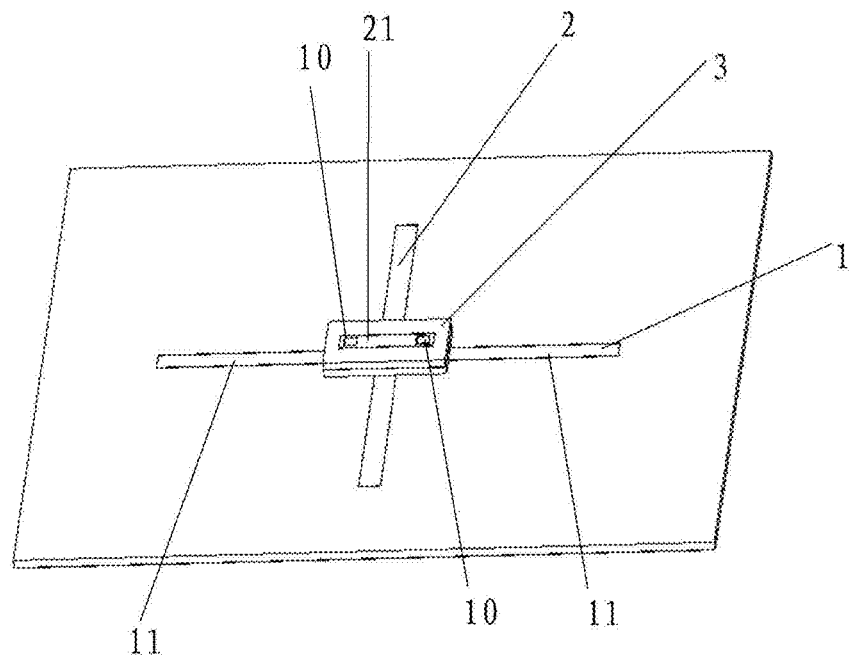
FIGS. 7 and 8 are a schematic perspective view and a partial sectional view, respectively, of a PCB for a base station antenna according to a fourth embodiment.
Figure 8:
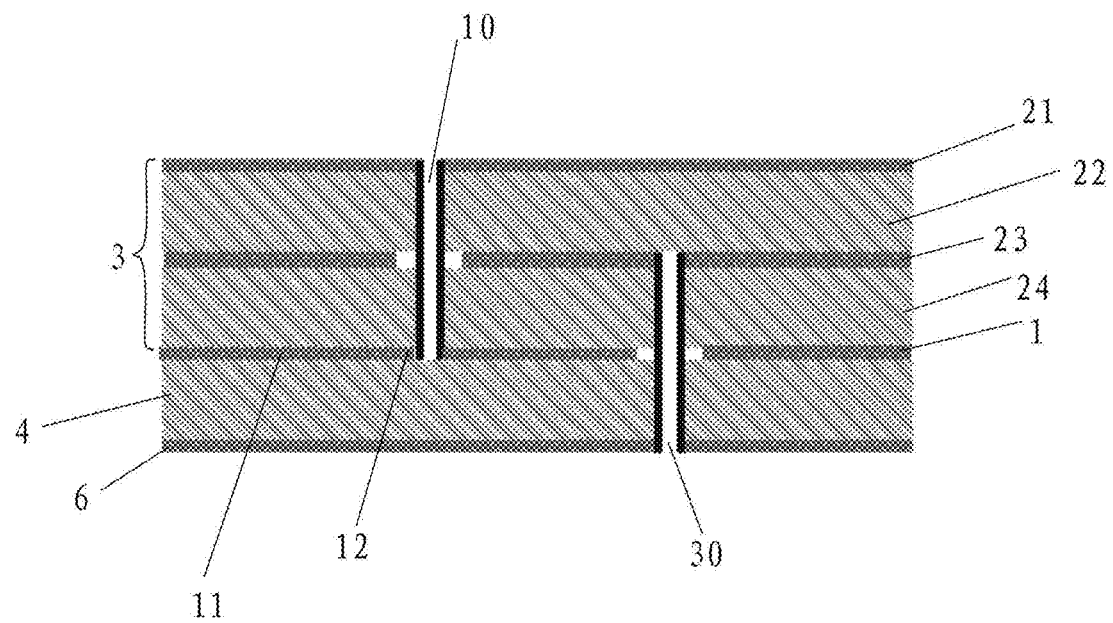

FIG. 7 is a schematic perspective view of a PCB for a base station antenna according to a fourth embodiment, where the PCB is only partially illustrated. The PCB may be, for example, a feed board for a base station antenna. FIG. 8 is a partial sectional view of the PCB for a base station antenna according to the fourth embodiment that is taken along a longitudinal center line of the jumper 3, where the jumper 3 is illustrated over half of its length, and may have a similar configuration over the other half of its length.

In the fourth embodiment, the PCB has a substrate layer 4 and a grounding layer 6 provided on a bottom side of the substrate layer 4. The PCB has a first conductive trace 1 and a second conductive trace 2 that are printed on a top side of the substrate layer 4 and that cross each other. Similar to the situation in the above embodiments, the first conductive trace 1 has two trace sections 11 that are separated by the second conductive trace 2, and adjacent ends 12 of the two trace sections 11 that are separated by the second conductive trace 2 are connected electrically by a jumper 3.

In the fourth embodiment, the jumper 3 is configured as a PCB element that may be formed integrally with the PCB so that soldering may be omitted. Alternatively, the PCB element may be a separate component and may be connected to the PCB by soldering.

The PCB element has a substrate layer 22, a conductive trace 21 provided on a top side of the substrate layer 22, a grounding layer 23 provided on the bottom side of the substrate layer 22, and an additional substrate layer 24. The PCB element has two PTHs 10 (only one of which is shown on FIG. 8) that are electrically connected to the conductive trace 21. The PCB element is electrically connected to one of said adjacent ends 12 of the two trace sections 11 through a first of the two PTHs and is electrically connected to the other of the adjacent ends 12 of the two trace sections 11 through a second of the two PTHs. One of the two PTHs 10 is visible in FIG. 8, which electrically connects the conductive trace 21 with the end 12 of one of the two trace sections 11 of the first conductive trace 1. The grounding layer 23 of the PCB element and the grounding layer 6 of the PCB are connected electrically through a third PTH 30 that extends through the PCB and into the PCB element.

In the fourth embodiment, the grounding layer 23 of the jumper 3 may be used for impedance match of the PCB, and thus can improve the return loss performance of the PCB.

Figure 9:
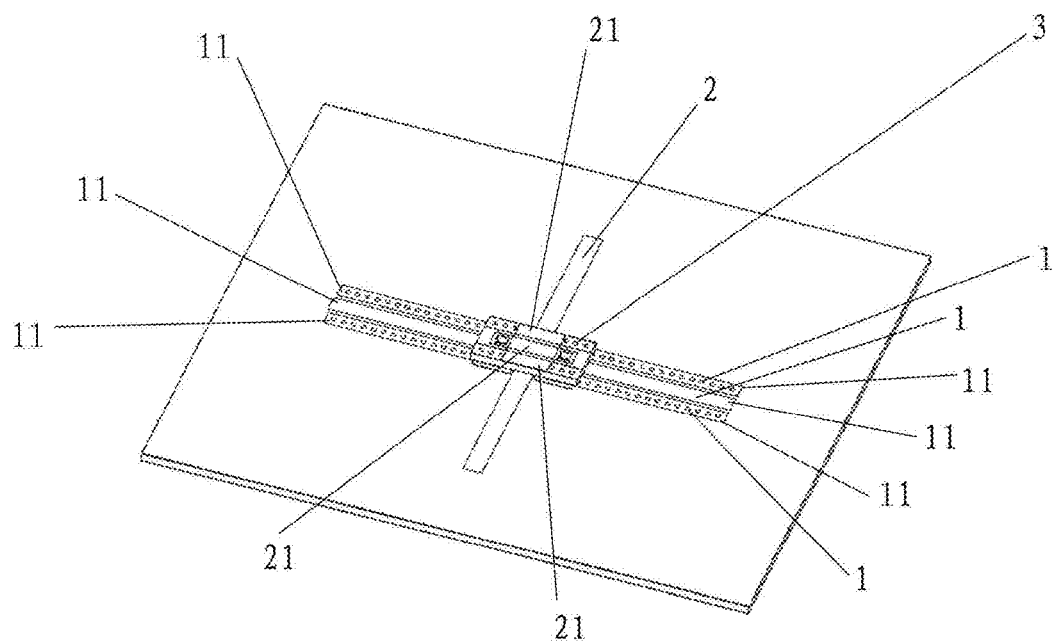
FIGS. 9 and 10 are a schematic perspective view and an exploded view, respectively, of a PCB for a base station antenna according to a fifth embodiment.
Figure 10:
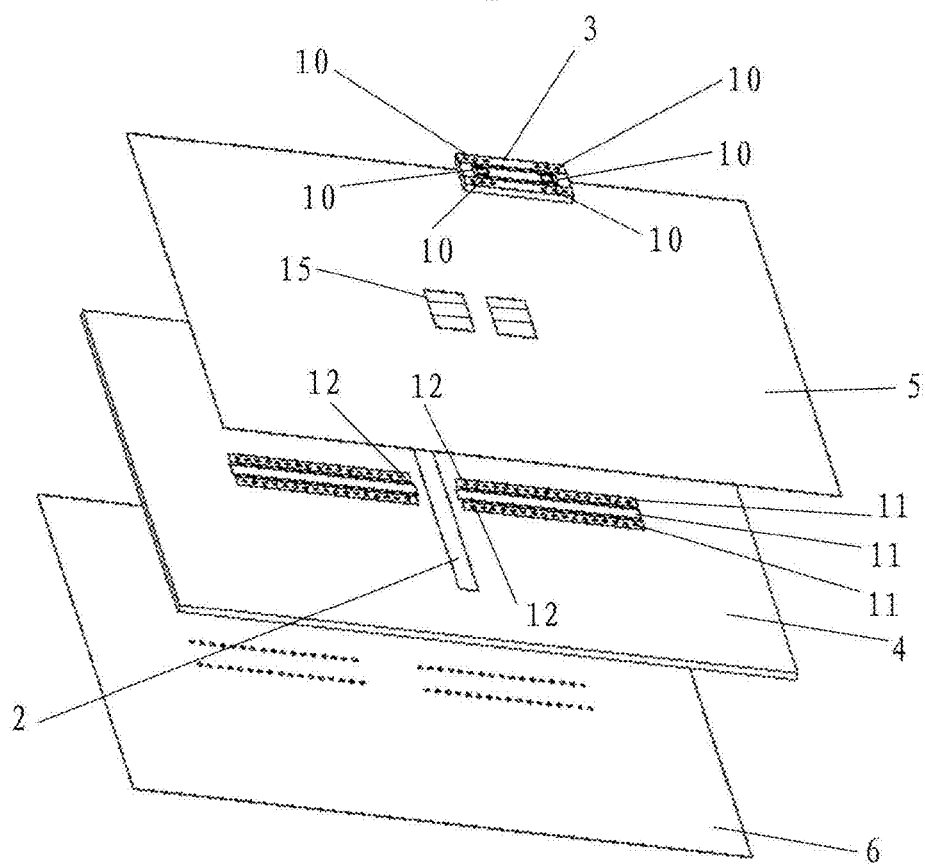

FIGS. 9 and 10 are a schematic perspective view and an exploded view, respectively, of a PCB for a base station antenna according to a fifth embodiment. In FIGS. 9 and 10, the PCB for a base station antenna is only illustrated partially. The PCB may be, for example, a feed board for a base station antenna.

In the fifth embodiment, the PCB has a substrate layer 4, a solder mask 5 provided on one side of the substrate layer 4, and a grounding layer 6 provided on the other side of the substrate layer 4. These layers may be formed integrally. The PCB has three first conductive traces 1 extending side by side and one second conductive trace 2, which are printed on the substrate layer 4. Each first conductive trace 1 has two trace sections 11 that are separated by the second conductive trace 2, and adjacent ends 12 of the two trace sections 11 of each first conductive trace 1 that are separated by the second conductive trace 2 are electrically connected by a respective jumper 3. The three first conductive traces 1 may be configured as a coplanar waveguide structure, where a central of the first conductive traces 1 is configured as a signal trace, and the other two of the first conductive traces 1 are configured as grounding traces.

In the fifth embodiment, the jumper 3 is configured as a PCB element that has a substrate layer and three adjacent conductive traces 21 are arranged on this substrate layer and extend side by side, where each conductive trace 21 of the PCB element is electrically connected to the two adjacent ends 12 of one of the three first conductive traces 1 by soldering through respective two PTHs 10. For such soldering, the solder mask 5 may have two groups of openings 15, and each group has three openings 15 that are arranged side by side. In FIG. 10, only one of the openings is provided with a reference numeral 15. Alternatively, the PCB element may be made with the PCB integrally, and thus soldering may be omitted.

In various embodiments, a single PTH or a plurality of PTHs may be used for each electrical connection location. As can be seen in FIGS. 9 and 10, three PTHs 10 may be used for each electrical connection location on the side grounding traces (two side first conductive traces 1), and a single PTH 10 may be used for each electrical connection location on the central signal trace (the central first conductive trace 1). In various embodiments, the number of PTHs is exemplary. In principle, any number of PTHs may be used for each electrical connection location.

It will be understood that the terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprise" and "include" (and variants thereof), when used in this specification, specify the presence of stated operations, elements, and/or components, but do not preclude the presence or addition of one or more other operations, elements, components, and/or groups thereof. As used herein, the term "and/or" includes any and all combinations of one or more of the associated listed items. Like reference numbers signify like elements throughout the description of the figures.

The thicknesses of elements in the drawings may be exaggerated for the sake of clarity. Further, it will be understood that when an element is referred to as being "on," "coupled to" or "connected to" another element, the element may be formed directly on, coupled to or connected to the other element, or there may be one or more intervening elements therebetween. In contrast, terms such as "directly on," "directly coupled to" and "directly connected to," when used herein, indicate that no intervening elements are present. Other words used to describe the relationship between elements should be interpreted in a like fashion (i.e., "between" versus "directly between", "attached" versus "directly attached," "adjacent" versus "directly adjacent", etc.).

Terms such as "top", "bottom," "upper," "lower," "above," "below," and the like are used herein to describe the relationship of one element, layer or region to another element, layer or region as illustrated in the figures. It will be understood that these terms are intended to encompass different orientations of the device in addition to the orientation depicted in the figures.

It will be understood that, although the terms "first," "second," etc. may be used herein to describe various elements, these elements should not be limited by these terms. These terms are only used to distinguish one element from another. Thus, a first element could be termed a second element without departing from the teachings of the inventive concept.

It will also be appreciated that all example embodiments disclosed herein can be combined in any way.

Finally, it is to be noted that, the above-described embodiments are merely for understanding the present invention but not constitute a limit on the protection scope of the present invention. For those skilled in the art, modifications may be made on the basis of the above-described embodiments, and these modifications do not depart from the protection scope of the present invention.

What is claimed is:

1. A printed circuit board for a base station antenna including a substrate layer, a first conductive trace and a second conductive trace which are printed on the substrate layer and cross each other, wherein the first conductive trace has two trace sections separated by the second conductive trace, wherein adjacent ends of the two trace sections separated by the second conductive trace are connected electrically by a jumper, wherein the jumper has an electrical conductor, is electrically isolated from the second conductive trace and is fixed on the printed circuit board, and wherein the electrical conductor is connected electrically with the two trace sections at the adjacent ends, wherein the first conductive trace and the second conductive trace are microstrip lines, respectively.

2. The printed circuit board for a base station antenna of claim 1, wherein the jumper is a separate component and is fixed on the printed circuit board by soldering, and wherein the electrical conductor and the two trace sections are connected electrically at the adjacent ends by soldering.

3. The printed circuit board for a base station antenna of claim 2, wherein the jumper has a plug element inserted into a hole of the printed circuit board.

4. The printed circuit board for a base station antenna of claim 3, wherein the jumper is composed of only the electrical conductor, and wherein the electrical conductor is configured as a bridge element and has at least one needle-like projection as the plug element.

5. The printed circuit board for a base station antenna of claim 4, wherein the electrical conductor has two pairs of needle-like projections, and the printed circuit board has two corresponding pairs of holes for receiving the needle-like projections in the region of the adjacent ends of the two trace sections.

6. The printed circuit board for a base station antenna of claim 4, wherein the printed circuit board has a grounding layer with openings around the holes for receiving the needle-like projections for electrical isolation.

7. The printed circuit board for a base station antenna of claim 1, wherein the printed circuit board comprises a plurality of the first conductive traces which are arranged to extend side by side and adjacent to each other, each with respective two trace sections separated by the second conductive trace.

8. The printed circuit board for a base station antenna of claim 1, wherein the printed circuit board is a feed board for radiating elements of a base station antenna.

9. A printed circuit board for a base station antenna including a substrate layer, a first conductive trace and a second conductive trace which are printed on the substrate layer and cross each other, wherein the first conductive trace has two trace sections separated by the second conductive trace, wherein adjacent ends of the two trace sections separated by the second conductive trace are connected electrically by a jumper, wherein the jumper has an electrical conductor, is electrically isolated from the second conductive trace and is fixed on the printed circuit board, and wherein the electrical conductor is connected electrically with the two trace sections at the adjacent ends, wherein the jumper is configured as a printed circuit board (PCB) element that has a substrate layer and a conductive trace as the electrical conductor.

10. The printed circuit board for a base station antenna of claim 9, wherein, the PCB element is a separate component and is fixed on the printed circuit board by soldering, wherein the conductive trace of the PCB element and the two trace sections are connected electrically at said adjacent ends by soldering; or the PCB element is made with the printed circuit board integrally.

11. The printed circuit board for a base station antenna of claim 9, wherein the PCB element is disposed on the printed circuit board in a standing manner, wherein the PCB element is configured as a bridge element having two legs, wherein the printed circuit board has two holes inserted by the two legs in the region of the adjacent ends, and the conductive trace of the PCB element is soldered with the adjacent ends of the two trace sections in the region of the two legs.

12. The printed circuit board for a base station antenna of claim 11, wherein the printed circuit board has a grounding layer, and the PCB element has a grounding layer, and wherein at least one of the two holes is formed as a plated through hole (PTH), and the grounding layer of the PCB element is electrically connected to the grounding layer of the printed circuit board by soldering in said PTH.

13. The printed circuit board for a base station antenna of claim 9, wherein the PCB element is disposed on the printed circuit board horizontally.

14. The printed circuit board for a base station antenna of claim 13, wherein the conductive trace of the PCB element is disposed on a side of the substrate layer of the PCB element facing away from the printed circuit board, and the PCB element has two plated through holes (PTHs) that are in contact with the conductive trace of the PCB element, wherein the PCB element is electrically connected to one of said adjacent ends of the two trace sections through a first of the two PTHs, and is electrically connected to the other of the adjacent ends of the two trace sections through a second of the two PTHs.

15. The printed circuit board for a base station antenna of claim 14, wherein the PCB element is soldered with the one of the adjacent ends of the two trace sections through the first PTH and is soldered with the other of the adjacent ends of the two trace sections through the second PTH.

16. The printed circuit board for a base station antenna of claim 14, wherein the printed circuit board has a grounding layer and the PCB element has a grounding layer, wherein the grounding layer of the PCB element is electrically connected to the grounding layer of the printed circuit board through a third PTH extending in the printed circuit board and in the PCB element.

17. The printed circuit board for a base station antenna of claim 16, wherein the PCB element has an additional substrate layer on a side of its grounding layer opposite to the substrate layer of the PCB element.

18. A printed circuit board for a base station antenna including a substrate layer, a first conductive trace and a second conductive trace which are printed on the substrate layer and cross each other, wherein the first conductive trace has two trace sections separated by the second conductive trace, wherein adjacent ends of the two trace sections separated by the second conductive trace are connected electrically by a jumper, wherein the jumper has an electrical conductor, is electrically isolated from the second conductive trace and is fixed on the printed circuit board, and wherein the electrical conductor is connected electrically with the two trace sections at the adjacent ends, wherein the printed circuit board has three first conductive traces which extend side by side and are adjacent to each other, wherein the three first conductive traces are formed as a coplanar waveguide structure, wherein a central one of the three first conductive traces is formed as a signal trace, and the other two of the first conductive traces are formed as grounding traces, wherein the three first conductive traces are respectively interrupted by the second conductive trace into two trace sections, and wherein the respective two trace sections of each of the first conductive traces are electrically connected to each other by the common jumper.

19. The printed circuit board for a base station antenna of claim 18, wherein the jumper is formed as a printed circuit board (PCB) element having three conductive traces as the electrical conductors that extend side by side and are adjacent to each other, and wherein each conductive trace of the PCB element is electrically connected to said two adjacent ends of one of the three first conductive traces through corresponding plated through holes (PTHs).

* * * * *